United States Patent [19]

Kohama

[11] Patent Number: 5,548,239
[45] Date of Patent: Aug. 20, 1996

[54] RADIO RECEIVER-TRANSMITTER APPARATUS AND SIGNAL CHANGEOVER SWITCH

[75] Inventor: Kazumasa Kohama, Kanagawa, Japan

[73] Assignee: Sony Corporation, Japan

[21] Appl. No.: 245,441

[22] Filed: May 10, 1994

[30] Foreign Application Priority Data

May 21, 1993 [JP] Japan .................................. 5-142721

[51] Int. Cl.$^6$ .................................................. H04B 1/44
[52] U.S. Cl. ......................... 327/408; 327/416; 333/103; 455/82; 455/83
[58] Field of Search ................................ 455/78, 82, 83; 327/408, 416, 427, 436; 333/101, 103, 104, 262; 307/111, 112, 115

[56] References Cited

U.S. PATENT DOCUMENTS

| | | | |
|---|---|---|---|
| 4,399,439 | 8/1983 | Upadhyayula | 333/101 |
| 4,637,073 | 1/1987 | Selin et al. | 455/78 |
| 4,835,423 | 5/1989 | de Ferron et al. | 327/436 |
| 5,193,218 | 3/1993 | Shimo | 455/82 |

FOREIGN PATENT DOCUMENTS 0594434  4/1994  European Pat. Off. .

OTHER PUBLICATIONS

Gallium Arsenide and Related Compounds 1992. Proceedings of 19th Int'l. Symposium, Karuizawa, Japan, Sep. 28–Oct. 2, 1992; pp. 911–916; Kermarrec, C. et al. "High performance, low cost GaAs MMICs for personal phone applications at 1.9 GHz".

1990 IEEE MIT–S Int'l. Microwave Syposium Digest, Dallas, TX, May 8–10, 1990; pp. 453–456; Schindler, M. J. et al., "A high power 2–18 GHz T/R switch".

Electronics and Communications in Japan, Part 2, 1986, vol. 69, No. 1; pp. 63–71; Yamao, Y. et al., "GaAs broadband monolithic switches".

Electronic Engineering, Nov. 1984; vol. 56, No. 695; pp. 141–144, 149; Pengelly, R. S., "Transmit/receive module using GaAs ICs".

Microwave Journal, Dec. 1989; vol. 32, No. 12, pp. 119–122; Shifrin, M. et al., "Monolithic control components handle 27 W of RF power".

*Primary Examiner*—Andrew Faile
*Attorney, Agent, or Firm*—Ronald P. Kananen

[57] ABSTRACT

A radio receiver-transmitter apparatus equipped with a signal changeover switch which is capable of properly dealing with a high-power radio frequency signal and ensuring a desired insertion loss and superior isolation characteristic. The switch has a signal input terminal, a signal output terminal and a signal input-output terminal, and comprises a 1st FET unit connected to the input terminal and the input-output terminal, a 2nd FET unit connected to the input terminal and the ground, a 3rd FET unit connected to the output terminal and the input-output terminal, and a 4th FET unit connected to the output terminal and the ground. The gate width of each transistor in the 1st FET unit is so determined as to render the source-drain saturation current greater than the maximum current amplitude of the input signal fed from the input terminal, and each of the 2nd and 3rd FET units consists of one or more transistor stages equal in number to the result of rounding up the numerical value which is obtained by dividing the maximum voltage amplitude of the input signal fed from the signal input terminal, by the withstand voltage of the transistors in the 2nd and 3rd FET units.

3 Claims, 5 Drawing Sheets

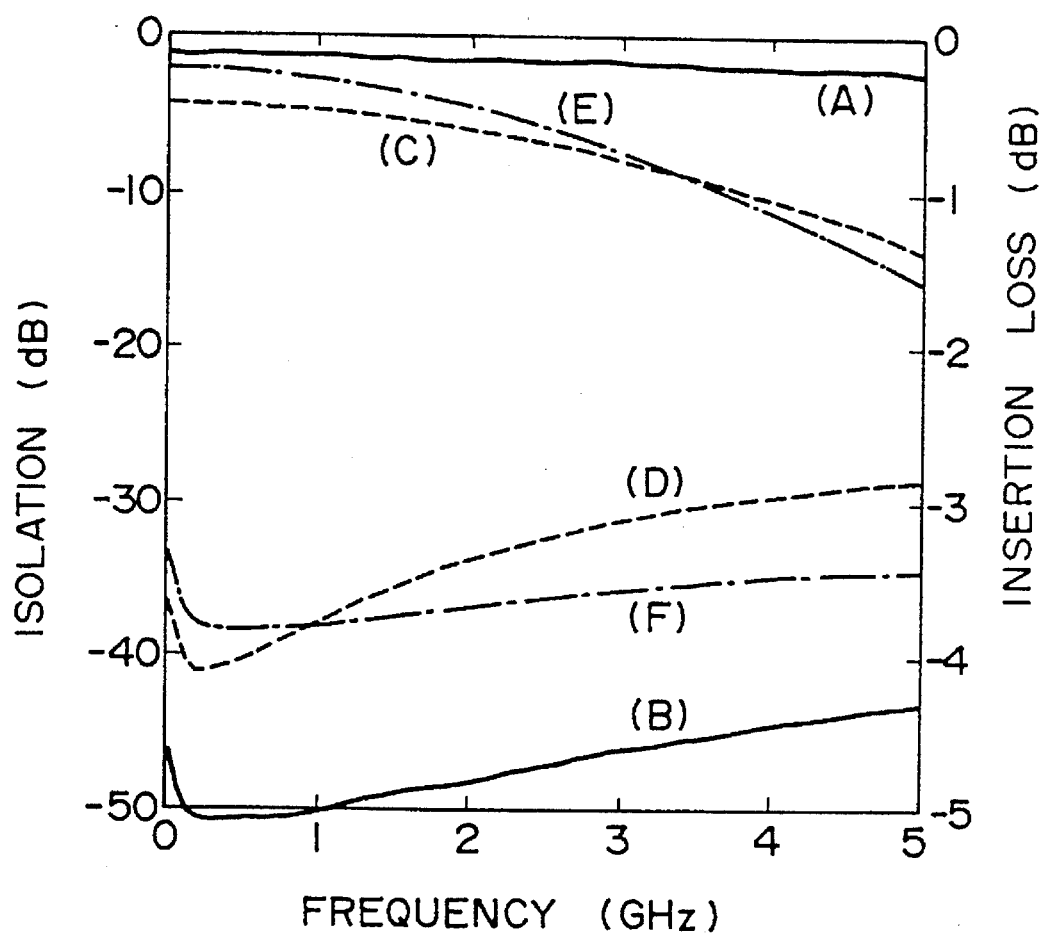

RADIO RECEIVER-TRANSMITTER APPARATUS AND SIGNAL CHANGEOVER SWITCH

BACKGROUND OF THE INVENTION

1. Field of the Invention

The present invention relates to a radio receiver-transmitter apparatus such as a TDMA (time-division multiple access) communication apparatus equipped with a signal changeover switch such as an SPDT (single-pole-dual-throw) switch which is adapted for selectively changing input and output signals between the apparatus and an antenna.

2. Description of the Related Art

In the TDMA communication apparatus, there is employed an SPDT switch for selectively outputting a radio frequency signal to an antenna or inputting such a signal therefrom. FIG. 1 is a conceptional circuit diagram of an exemplary SPDT switch. As shown, the SPDT switch comprises four units of field-effect transistors (FETs) and has a signal input terminal IN, a signal output terminal OUT and a signal input-output terminal IO.

One end of the 1st FET unit 5 is connected to the signal input terminal IN 2, while the other end thereof is connected to the signal input-output terminal IO 1. One end of the 2nd FET unit 6 is connected to the signal input terminal IN 2, while the other end thereof is grounded. One end of the 3rd FET unit 9 is connected to the signal output terminal OUT 3, while the other end thereof is connected to the signal input-output terminal IO 1. And one end of the 4th FET unit 8 is connected to the signal output terminal OUT 3, while the other end thereof is grounded. These FET units are composed of mutually equivalent field-effect transistors. In this specification, each FET unit signifies a configuration consisting of one or more stages of field-effect transistors. The signal input terminal IN 2 is connected to a transmitter of the communication apparatus, and the signal output terminal OUT 3 is connected to a receiver of the communication apparatus, and the signal input-output terminal IO 1 to the antenna, respectively.

When the SPDT switch is in a transmission mode for outputting a radio frequency signal from the transmitter of the communication apparatus to the antenna, the 1st FET unit 5 and the 4th FET unit 8 in the SPDT switch are turned on, while the 2nd FET unit 6 and the 3rd FET unit 9 are turned off. Therefore the radio frequency signal received at the signal input terminal IN 2 is delivered via the 1st FET unit 5 to the signal input-output terminal IO 1. Meanwhile, when the SPDT switch is in a reception mode for inputting a radio frequency signal from the antenna to the receiver of the communication apparatus, the 3rd FET unit 9 and the 2nd FET unit 6 in the SPDT switch are turned on, while the 4th FET unit 8 and the 1st FET unit 5 are turned off. Therefore the radio frequency signal received at the signal input-output terminal IO 1 is delivered via the 3rd FET unit 9 to the signal output terminal OUT 3.

In the case of a DC signal, satisfactory isolation is attainable if the SPDT switch is composed merely of the 1st FET unit 5 and the 3rd FET unit 9. That is, when the SPDT switch is in the transmission mode, none of leakage current is caused in the 3rd FET unit 9 which is in an off-state. Also when the SPDT switch is in the reception mode, none of leakage current is caused in the 1st FET unit 5 either which is in an off-state. However, since each field-effect transistor has a capacitive component, there arises a problem if the SPDT switch is so constituted as mentioned above for transmitting or receiving an AC signal. That is, even when the 1st FET unit 5 or the 3rd FET unit 9 is in an off-state, an AC signal leaks out from the 1st FET unit 5 or the 3rd FET unit 9 to consequently bring about failure in achieving complete isolation. Accordingly, in transmission or reception of an AC signal, it becomes necessary to lead any leakage of the AC signal to the ground by combining the 2nd FET unit 6 and the 4th FET unit 8 as described above to constitute the SPDT switch.

Generally the gate bias of the field-effect transistor varies depending on the voltage amplitude of an input AC signal. When an AC signal (having a maximum voltage amplitude $V_{RF}$) flows in the channel between the source and drain regions of the field-effect transistor under the condition where a DC gate voltage $Vg_{DC}$ is applied to the gate of the transistor, a gate bias Vg, which is formed of the DC gate voltage $Vg_{DC}$ and the maximum voltage amplitude $V_{RF}$ superimposed thereon, is applied between the gate and the channel of the transistor. Consequently the gate bias Vg applied to the gate varies by a maximum of $\pm \Delta Vg$ with respect to the gate voltage $Vg_{DC}$ at the same frequency as that of the AC signal. In the above, $\Delta Vg$ denotes the gate voltage variation which is determined by the maximum voltage amplitude $V_{RF}$ of the AC signal and is equal approximately to $k \times V_{RF}$ (where k is a constant smaller than 1). The constant k can be calculated univalently from the time constant, which is determined by the capacitance between the gate and the channel of the field-effect transistor, and the frequency of the AC signal.

At the time of signal transmission when the 1st FET unit 5 and the 4th FET unit 8 are in an on-state while the 2nd FET unit 6 and the 3rd FET unit 9 are in an off-state, normally a radio frequency signal of a high power flows in the SPDT switch. In this case, the gate bias of the field-effect transistor in the 1st FET unit 5 becomes Vg (=VON−$\Delta$Vg) due to the influence of the radio frequency signal flowing in the 1st FET unit 5. Denoted by VON is the DC gate voltage applied to the gate of the field-effect transistor in an on-state. As a result, the source-drain saturation current Idss of the field-effect transistor is reduced. If the current of the radio frequency signal flowing in the 1st FET unit 5 exceeds the source-drain saturation current Idss, the 1st FET unit 5 is rendered incapable of permitting a complete flow of the signal therein, whereby a distortion is generated in the radio frequency signal outputted from the SPDT switch to the antenna, or an insertion loss is caused in the SPDT switch. This phenomenon is graphically shows in FIG. 2. In this diagram, VBI denotes a built-in voltage, and VBR denotes a breakdown voltage.

At the time of signal transmission, if a high voltage having a maximum voltage amplitude $V_{RF}$ is applied to the source-drain regions of the 2nd FET unit 6 and the 3rd FET unit 9 in an off-state, the gate bias Vg (=VOFF+$\Delta$Vg) of the field-effect transistor in the 2nd FET unit 6 and the 3rd FET unit 9 exceeds the pinch-off voltage $V_{PS}$, so that the 2nd FET unit 6 or the 3rd FET unit 9 is turned on, and therefore a distortion is generated in the radio frequency signal outputted from the SPDT switch to the antenna, or some deterioration is caused in the isolation characteristic of the SPDT switch. This phenomenon is graphically shown also in FIG. 2. Denoted by VOFF is a DC gate voltage applied to the gate of the field-effect transistor in an off-state.

If a radio frequency signal of a high power flows in the SPDT at the time of signal reception when the 3rd FET unit 9 and the 2nd FET unit 6 are in an on-state while the 4th FET unit 8 and the 1st FET unit 5 are in an off-state, a phenomenon similar to that of the 1st FET unit 5 during the signal transmission occurs with regard to the field-effect transistor in the 3rd FET unit 9. Consequently the 3rd FET unit 9 is rendered incapable of permitting a complete flow of the signal therein, whereby a distortion is generated in the radio frequency signal outputted from the SPDT switch to the communication apparatus, or an insertion loss is induced in the SPDT switch.

At the time of signal reception, if a high voltage having a maximum amplitude $V_{RF}$ is applied to the source-drain regions of the 4th FET unit 8 and the 1st FET unit 5 in an off-state, there occurs a phenomenon similar to that of the 2nd FET unit 6 or the 3rd FET unit 9 during the signal transmission. As a result, a distortion is generated in the radio frequency signal outputted from the SPDT switch to the communication apparatus, or some deterioration is caused in the isolation characteristic of the SPDT switch.

In the conventional SPDT switch known heretofore, the 1st, 2nd, 3rd and 4th FET units are composed of mutually equivalent field-effect transistors as shown in FIG. 1. And the transmitting section (1st FET unit 5 and 4th FET unit 8) of the SPDT switch and the receiving section (3rd FET unit 9 and 2nd FET unit 6) thereof are mutually the same in configuration. And none of adequate countermeasure is prepared at all to prevent the above-described fault caused at the time of transmitting a high-power radio frequency signal, so that some disadvantages are prone to occur in the SPDT switch including a distortion of the radio frequency signal, generation of an insertion loss (power loss) and deterioration of the isolation characteristic.

An improved SPDT switch is disclosed in a first reference by M. J. Schindler, et al., "A High Power 2–18 GHz T/R Switch", IEEE MTT-S Digest, 1990, pp. 453–456. In this cited reference, there are described some improvements including that the gate width of each field-effect transistor is optimized by taking into consideration the level difference between a transmission power and a reception power (i.e., the gate width of each transistor for passing a high-power radio frequency signal is widened so as to prevent a distortion of the radio frequency signal or an increase of the insertion loss), and also that dual-gate field-effect transistors are employed for enhancing the withstand voltage characteristic and isolation characteristic in an off-state.

However, the improvements achieved in the above cited reference include no contrivance relative to a case where a great power is inputted to the SPDT switch at the time of transmission. More specifically, there exists a problem that the isolation characteristic is prone to be deteriorated in the 2nd FET unit 6. Furthermore, the withstand voltage of a dual-gate FET is at most twice that of a single-gate FET, and it is impossible for the dual-gate FET to deal with a radio frequency signal of any greater power. Besides the above, the improvement attained in the isolation characteristic is at most twice or so. In addition, it is necessary to prepare a variety of field-effect transistors having different gate widths.

As mentioned above, the conventional SPDT switch or the one disclosed in the cited reference is not capable of dealing satisfactorily with a high-power radio frequency signal and is not adapted to realize desired characteristics with respect to the isolation and the insertion loss. And another problem is still existent with regard to complication and intricacy in both design and production due to an increase of the kinds of required field-effect transistors.

OBJECT AND SUMMARY OF THE INVENTION

It is an object of the present invention to provide a receiver-transmitter apparatus equipped with a signal changeover switch which is capable of dealing with a high-power radio frequency signal and realizing satisfactory performance with a desired insertion loss (power loss) and superior isolation characteristic without any increase of the kinds of required field-effect transistors.

For the purpose of achieving the above object, the signal changeover switch according to the present invention has a signal input terminal, a signal output terminal and a signal input-output terminal, and comprises four units of field-effect transistors. One end of the 1st FET unit is connected to the signal input terminal, while the other end thereof is connected to the signal input-output terminal. One end of the 2nd FET unit is connected to the signal input terminal, while the other end thereof is grounded. One end of the 3rd FET unit is connected to the signal output terminal, while the other end thereof is connected to the signal input-output terminal. And one end of the 4th FET unit is connected to the signal output terminal, while the other end thereof is grounded. Each of the transistors constituting the 1st FET unit has such a gate width as to render the source-drain saturation current greater than the maximum current amplitude of the signal fed to the signal input terminal. The 2nd FET unit consists of one or more transistor stages equal in number to the result of rounding up the numerical value which is obtained by dividing the maximum voltage amplitude of the input signal fed from the signal input terminal, by the withstand voltage of the transistors constituting the 2nd FET unit. And the 3rd FET unit consists of one or more transistor stages equal in number to the result of rounding up the numerical value which is obtained by dividing the maximum voltage amplitude of the input signal fed from the signal input terminal, by the withstand voltage of the transistors constituting the 3rd FET unit.

In the signal changeover switch of the present invention, it is preferred that the number of transistor stages in the 1st FET unit is so determined as to minimize the insertion loss and the isolation value in the 1st FET unit, and the gate width of each transistor in the 2nd and 3rd FET units is so determined as to minimize the insertion loss and the isolation value in the 2nd and 3rd FET units.

It is also preferred that the number of transistor stages in the 4th FET unit is determined depending on the power of a received signal, and the gate width of each transistor in the 4th FET unit is so determined as to minimize the insertion loss and the isolation value in the 4th FET unit.

In the signal changeover switch of the present invention, each of the transistors constituting the 1st FET unit has such a gate width as to render the source-drain saturation current greater than the maximum current amplitude of the input signal fed from the signal input terminal, thereby preventing generation of a distortion in the output signal or any increase of the insertion loss even when a high-power radio frequency signal is inputted to the 1st FET unit at the time of transmitting a high-power radio frequency signal.

If the gate width of each transistor in the 1st FET unit is widened, there may occur a situation where the isolation characteristic of the transistor is deteriorated to consequently fail in achieving the desired value. In such a case, the 1st FET unit can be constituted of multiple stages of transistors. The number of transistor stages in the 1st FET unit is so determined as to minimize the insertion loss and the isolation value in the 1st FET unit, whereby the capacitive component of such transistor is reduced to a submultiple of the number of stages to eventually prevent deterioration of the isolation characteristic.

The 2nd FET unit consists of one or more transistor stages equal in number to the result of rounding up the numerical value which is obtained by dividing the maximum voltage amplitude of the input signal fed from the signal input terminal, by the withstand voltage of the transistors constituting the 2nd FET unit. And the 3rd FET unit consists of one or more transistor stages equal in number to the result of rounding up the numerical value which is obtained by dividing the maximum voltage amplitude of the input signal fed from the signal input terminal, by the withstand voltage of the transistors constituting the 3rd FET unit. Therefore, the capacitive component of each transistor in the 2nd and 3rd FET units is reduced to a submultiple of the number of stages, and the variation of the gate bias Vg caused in the field-effect transistor in an off-state is diminished to thereby prevent deterioration of the isolation characteristic even with respect to a high-power radio frequency signal.

If the number of transistor stages in the 2nd and 3rd FET units is increased, there may occur a disadvantageous situation where the insertion loss is induced to be greater than a desired value. In such a case, the gate width of each transistor in the 2nd and 3rd FET units may be so determined as to minimize the insertion loss and the isolation value in the 2nd and 3rd FET units.

The above and other features and advantages of the present invention will become apparent from the following description which will be given with reference to the illustrative accompanying drawings.

BRIEF DESCRIPTION OF THE DRAWINGS

FIG. 6 graphically shows the result of simulating the insertion loss and the isolation characteristic in both the signal changeover switch of the invention and the conventional SPDT switch of the related art.

DETAILED DESCRIPTION OF THE PREFERRED EMBODIMENTS

Hereinafter the present invention will be described in detail with reference to the preferred embodiments thereof shown in the accompanying drawings.

In a general TDMA communication system, a transmitted power is considerably greater than a received power. Therefore an adequate adjustment needs to be contrived with regard to the power in the transmission mode of the signal changeover switch, but there is no necessity of giving any particular consideration relative to the power in the reception mode of the switch. And in the reception mode, no signal is fed from the signal input terminal of the changeover switch. Accordingly the signal changeover switch of the present invention is adapted to be employed in such a communication system.

Figure 3:
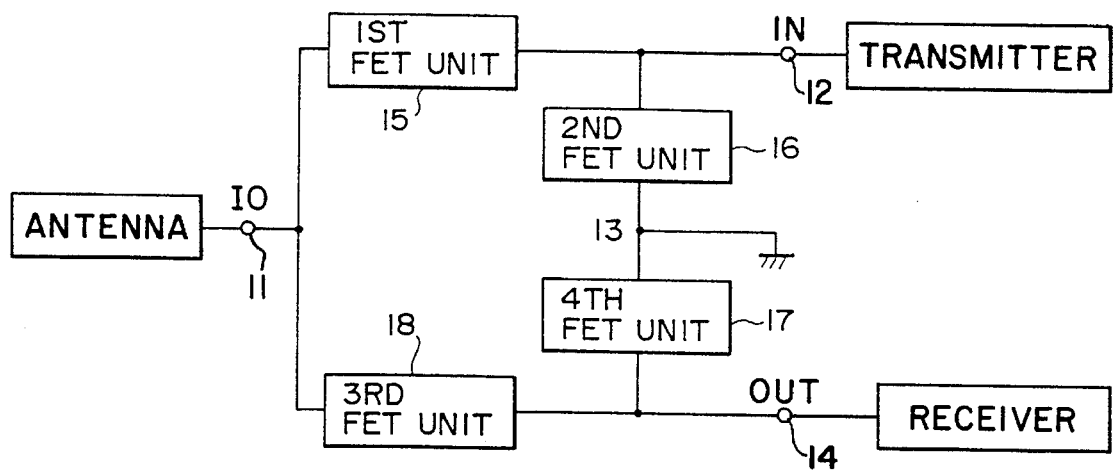
FIG. 3 is a conceptional diagram of a first embodiment representing the signal changeover switch of the present invention.

FIG. 3 is a conceptional diagram of a first embodiment representing the signal changeover switch of the present invention, which is specifically an SPDT switch. Similarly to the conventional SPDT switch known heretofore, the switch shown in this diagram has a signal input terminal IN 12, a signal output terminal OUT 14 and a signal input-output terminal IO 11, and comprises four units of field-effect transistors.

One end of the 1st FET unit 15 is connected to the signal input terminal IN 12, while the other end thereof is connected to the signal input-output terminal IO 11. One end of the 2nd FET unit 16 is connected to the signal input terminal IN 12, while the other end thereof is connected to the ground 13. One end of the 3rd FET unit 18 is connected to the signal output terminal OUT 14, while the other end thereof is connected to the signal input-output terminal IO 11. And one end of the 4th FET unit 17 is connected to the signal output terminal OUT 14, while the other end thereof is connected to the ground 13. In this switch, each of the FET units signifies a configuration consisting of one or more stages of field-effect transistors. The signal input terminal IN 12 is connected to a transmitter of a communication apparatus, and the signal output terminal OUT 14 to a receiver of the communication apparatus, and the signal input-output terminal IO 11 to an antenna, respectively.

When the signal changeover switch is in a transmission mode for outputting a radio frequency signal from the transmitter of the communication apparatus to the antenna, the 1st FET unit 15 and the 4th FET unit 17 are turned on in the switch while the 2nd FET unit 16 and the 3rd FET unit 18 are turned off. Accordingly the radio frequency signal is fed from the signal input terminal IN 12 and is delivered via the 1st FET unit 15 to the signal input-output terminal IO 11.

When the signal changeover switch is in a reception mode for inputting a radio frequency signal from the antenna to the receiver of the communication apparatus, the 3rd FET unit 18 and the 2nd FET unit 16 are turned on in the switch while the 4th FET unit 17 and the 1st FET switch 15 are turned off. Accordingly the radio frequency signal is fed from the signal input-output terminal IO 11 and is delivered via the 3rd FET unit 18 to the signal output terminal OUT 14.

Figure 4:
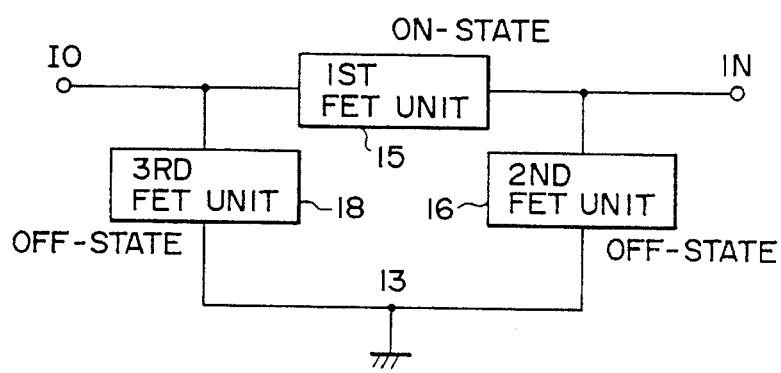
FIG. 4 is an equivalent circuit diagram of the signal changeover switch of the invention in a transmission mode.

It is in the transmission mode that an adequate adjustment relative to the power is required in the signal changeover switch. FIG. 4 shows an equivalent circuit of the signal changeover switch in the transmission mode. In this mode, the 1st FET unit 15 and the 4th FET unit 17 are in a low-impedance state, whereas the 2nd FET unit 16 and the 3rd FET unit 18 are in a high-impedance state. Since no power is substantially applied to the 4th FET unit 17 in FIG. 3, this FET unit 17 is omitted in the illustration of FIG. 4. As obvious from this diagram, an adequate adjustment relative to the current is required in the 1st FET unit 15, and an adequate adjustment relative to the voltage is required in the 2nd FET unit 16 and the 3rd FET unit 18.

The constitutions of the 1st FET unit 15, 2nd FET unit 16 and 3rd FET unit 18 are determined in the following manner.

First, the gate width of each of the field-effect transistors constituting the 1st FET unit 15 is determined on the basis of the maximum current amplitude of the radio frequency signal fed to the signal input terminal IN 12 of the signal changeover switch in the transmission mode. More specifically, the gate width is so determined as to render the source-drain saturation current Idss of each transistor greater than the maximum current amplitude of the signal fed from the signal input terminal IN 12 in the transmission mode.

The 2nd FET unit 16 consists of one or more transistor stages equal in number to the result of rounding up the numerical value which is obtained by dividing the maximum voltage amplitude of the input signal fed from the signal input terminal IN 12 in the transmission mode, by the withstand voltage of the transistors constituting the 2nd FET unit 16. Also the 3rd FET unit 18 consists of one or more transistor stages equal in number to the result of rounding up the numerical value which is obtained by dividing the maximum voltage amplitude of the input signal fed from the signal input terminal IN 12 in the transmission mode, by the withstand voltage of the transistors constituting the 3rd FET unit 18.

Thus the signal changeover switch can be devised adaptively with respect to both current and voltage, so that if a high-power radio frequency signal is inputted to the 1st FET unit 15 when the signal changeover switch is in the transmission mode, it is possible to prevent generation of a distortion in the signal outputted from the switch or occurrence of an insertion loss in the switch. And it is further possible to reduce the variation of the gate bias Vg in each of the transistors of the 2nd FET unit 16 and the 3rd FET unit 18 in an off-state, hence preventing deterioration of the isolation characteristic of the signal changeover switch even when the input radio frequency signal has a high power.

In case the gate width of each transistor in the 1st FET unit 15 is widened, there may occur a disadvantageous situation where the leakage current in an off-state is increased to consequently cause deterioration of the isolation characteristic of the transistor, and therefore the desired isolation characteristic is not achievable in the signal reception mode where the signal changeover switch is set in its receiving state. In such a case, the 1st FET unit 15 can be composed of multiple stages of field-effect transistors. The number of stages in the 1st FET unit 15 may be so determined as to minimize the insertion loss and the isolation value in the 1st FET unit 15. Due to such constitution, the capacitive component of each field-effect transistor can be reduced to a submultiple of the number of stages to thereby prevent deterioration of the isolation characteristic.

In case the number of transistor stages in the 2nd FET unit 16 and the 3rd FET unit 18 is increased, there may occur a disadvantageous situation where the insertion loss is caused to be greater than a desired value. Generally, there exists the relationship that the isolation characteristic is more deteriorated in accordance with a reduction of the insertion loss. In view of this point, the gate width of each of the transistors constituting the 2nd FET unit 16 and the 3rd FET unit 18 may be optimized in a manner to possibly minimize both the insertion loss and the isolation value in the 2nd FET unit 16 and the 3rd FET unit 18.

Furthermore the number of transistor stages in the 4th FET unit 17 is determined in dependence on the power of the received signal so as to prevent deterioration of the isolation characteristic of the 4th FET unit 17 in the reception mode. And the gate width of each of the transistors constituting the 4th FET unit 17 is so determined as to possibly minimize the insertion loss and the isolation value in the 4th FET unit 17, whereby the insertion loss in the 4th FET unit 17 can be minimized.

Figure 5:
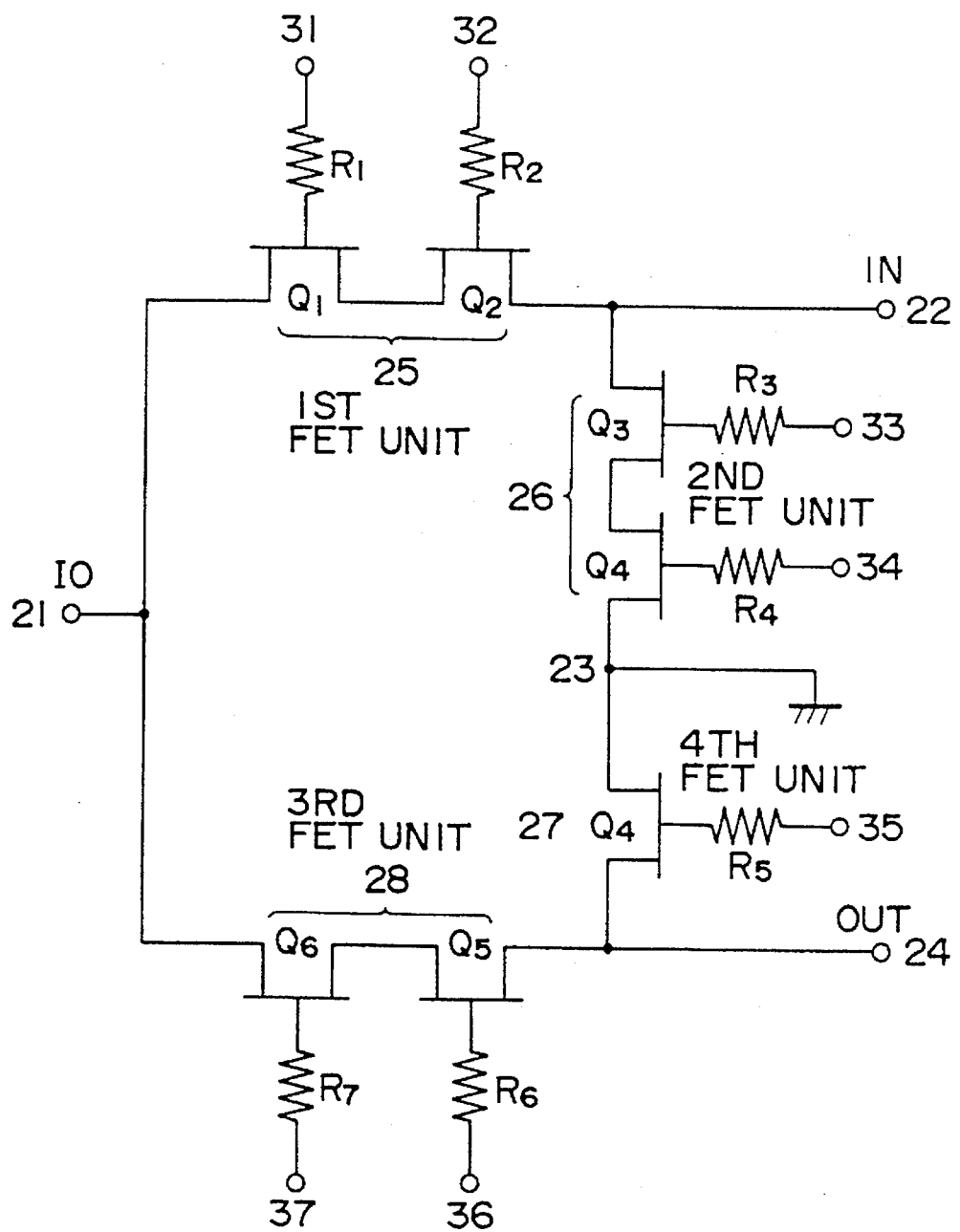
FIG. 5 shows a second embodiment representing the signal changeover switch of the invention.

FIG. 5 shows a second embodiment of the signal changeover switch which is capable of properly dealing with a radio frequency input signal having a high power of 1 W or so, The following are the details of an input signal received from a signal input terminal in the transmission mode and those of field-effect transistors constituting individual FET units, The maximum voltage amplitude and the maximum current amplitude of the input signal are preset at the time of designing the communication apparatus where the switch is to be employed, The input signal transmission line is connected by a 50-ohm matching system, Maximum voltage amplitude of input signal: 10 V
Maximum current amplitude of input signal: 0.2 A
  1st FET unit 15
    Gate width: 2 mm
    Number of stages: 2
  2nd FET unit 16
    Gate width: 0.5 mm
    Withstand voltage: 7 V
    Number of stages: 2
  3rd FET unit 18
    Gate width: 0.5 mm
    Withstand voltage 7 V
    Number of stages: 2
  4th FET unit 17
    Gate width: 0.5 mm
    Withstand voltage: 7 V
    Number of stage: 1

Due to the structure where the gate width of each field-effect transistor in the 1st FET unit 15 is set to 2 mm, the source-drain saturation current Idss in each transistor in an on-state is approximately 0.3 A, which is sufficiently greater than the maximum current amplitude of the input signal in the transmission mode. And the number of stages of the field-effect transistors constituting the 1st FET unit 15 is selectively determined to be 2 with the isolation characteristic taken into consideration. However, satisfactory isolation characteristic is not attainable when the 1st FET unit 15 is composed merely of a single transistor stage.

The withstand voltage of the field-effect transistors constituting the 2nd FET unit 16 and the 3rd FET unit 18 is set to 7 V. (Maximum voltage amplitude of input signal)/(Withstand voltage of field-effect transistor)=10/7. Therefore the number of stages of the field-effect transistors is determined to be 2 on the basis of the above calculation. And because of the structure where each of the transistors constituting the 3rd FET unit 18 has a gate width of 0.5 mm, the source-drain saturation current Idss in an on-state is 0.1 A or so, which is sufficiently greater than the maximum current amplitude of the input signal fed from the signal input-output terminal IO 11 in the reception mode of the switch. With regard to the 2nd FET unit 16, none of adjustment is necessary relative to the current, and a consideration needs to be given merely to the insertion loss alone. For this reason, the gate width of each transistor in the 2nd FET unit 16 is set to 0.5 mm.

The withstand voltage of the transistors in the 4th FET unit 17 is 7 V, which is sufficiently higher than the maximum voltage amplitude (designed value=0.1 V) of the input signal fed from the signal input-output terminal IO 11 in the reception mode. Therefore the number of stage of the transistors constituting the 4th FET unit 17 is determined to be 1. And for the purpose of possibly minimizing the insertion loss and the isolation value, the gate width of each transistor in the 4th FET unit 17 is set to 0.5 mm.

Figure 1:
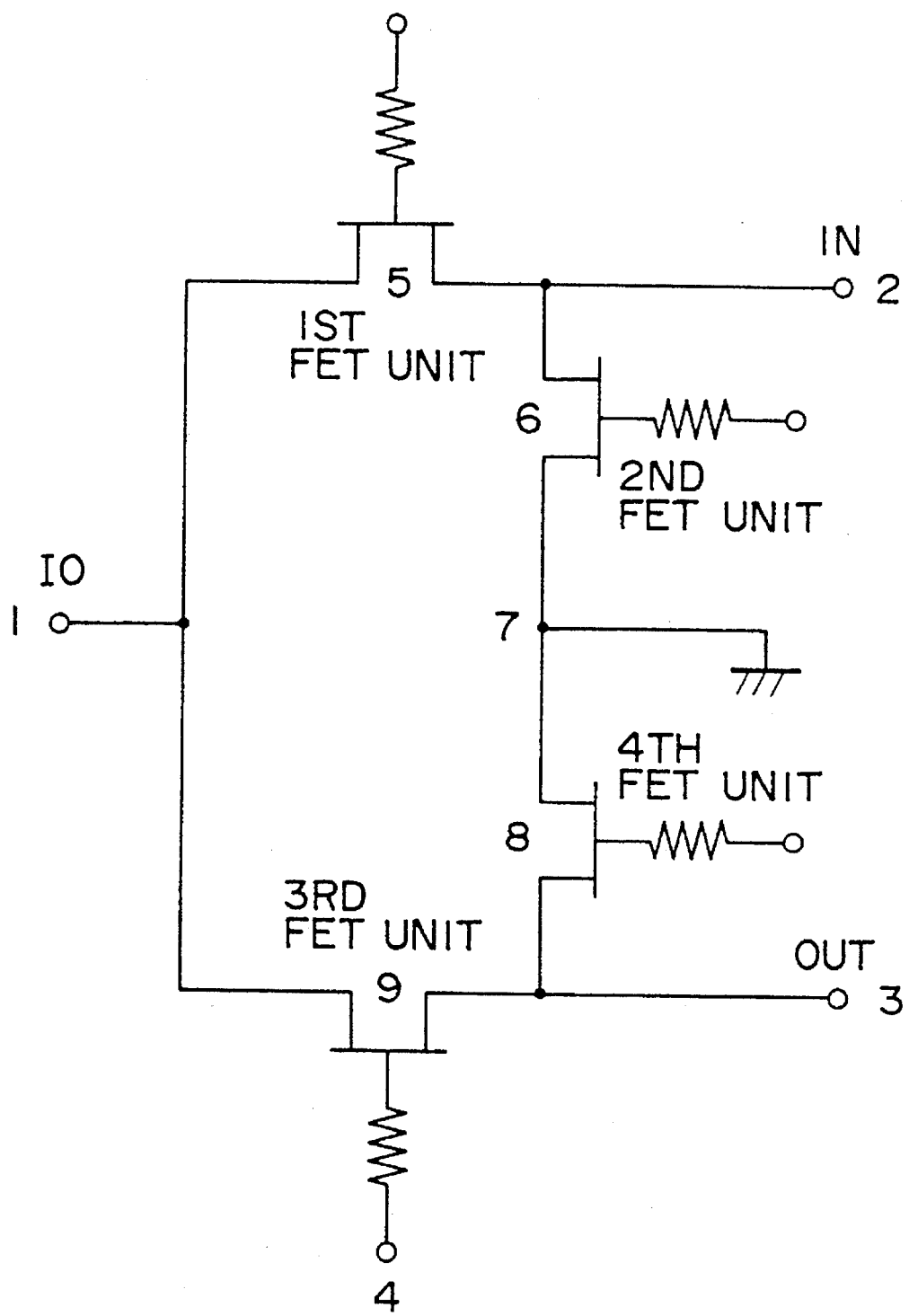
FIG. 1 schematically shows an exemplary constitution of a conventional SPDT switch according to the related art.
Figure 2:
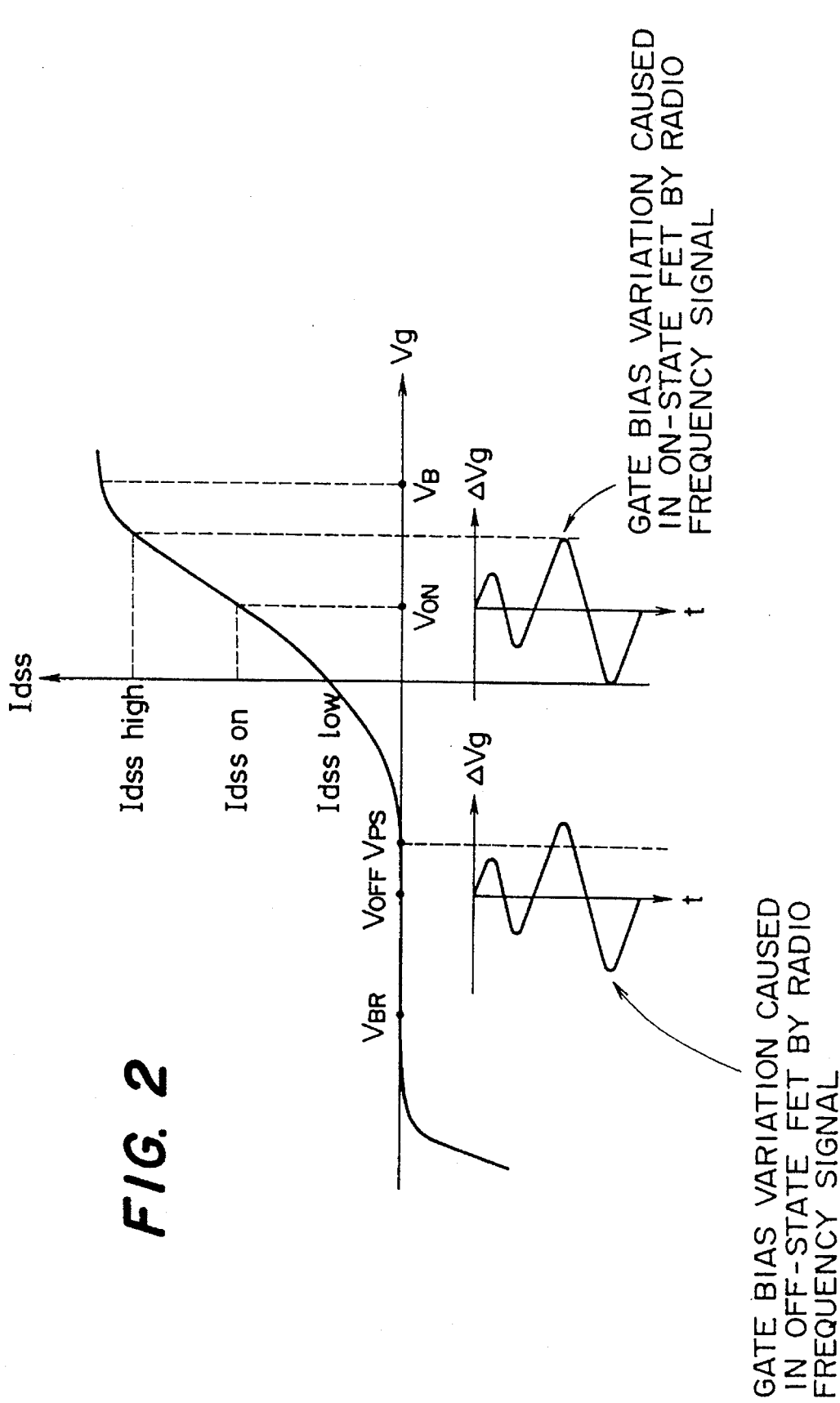
FIG. 2 graphically shows the relationship between a gate bias Vg and a source-drain saturation current Idss in a field-effect transistor used in a signal changeover switch.

FIG. 1 shows an exemplary constitution of a conventional SPDT switch according to the related art. In this switch, each of the FET units consists of one stage of field-effect transistors, and each transistor has a gate width of 1 mm. In the conventional SPDT switch of FIG. 1, none of adequate adjustment is devised with respect to the current or the voltage in the transmission mode of the switch.

In comparison with the conventional SPDT switch of the related art shown in FIG. 1, a second embodiment representing the signal changeover switch of the present invention shown in FIG. 5 has some differences including that the gate width of each transistor in a 1st FET unit 25 in the switch of the invention is twice the gate width in the conventional switch, so that the current allowable to flow in the switch of the invention is rendered twice. Moreover, each of the 1st FET unit 25, 2nd FET unit 26 and 3rd FET unit 28 consists of 2stages of field-effect transistors, whereby the withstand voltage is increased to be twice to consequently ensure further enhanced isolation characteristic.

FIG. 6 graphically shows the results of simulating the insertion loss and the isolation characteristic of both the signal changeover switch of the invention in FIG. 5 and the conventional SPDT switch of the related art in FIG. 1. The lines in the graphic representation of FIG. 6 denote the following characteristics. The insertion loss is expressed by an S parameter (S21) which signifies the degree of passage of a radio frequency power.

Solid line (A): Insertion loss between signal input-output terminal IO 21 and signal input terminal IN 22 in the signal changeover switch of the invention in a transmission mode Solid line (B): Isolation characteristic between signal input-output terminal IO 21 and signal output terminal OUT 24 in the signal changeover switch of the invention in a transmission mode Dotted line (C): Insertion loss between signal input-output terminal IO 21 and signal output terminal OUT 24 in the signal changeover switch of the invention in a reception mode Dotted line (D): Isolation characteristic between signal input-output terminal IO 21 and signal input terminal IN 22 in the signal changeover switch of the invention in a reception mode Chained line (E): Insertion loss between signal input-output terminal IO 1 and signal input terminal IN 2 (or signal output terminal OUT 3) in the conventional SPDT switch of the related art in a transmission mode (or reception mode)

Chained line (F): Isolation characteristic between signal input-output terminal IO 1 and signal output terminal OUT 3 (or signal input terminal IN 2) in the conventional SPDT switch of the related art in a transmission mode (or reception mode)

In the known constitution of the conventional SPDT switch, the 1st and 2nd FET units 25, 26 and the 3rd and 4th FET units 28, 27 are structurally the same and therefore have the same characteristic in both transmission and reception modes. As obvious from FIG. 6, the insertion loss and the isolation characteristic in the signal changeover switch of the present invention are slightly inferior in the reception mode. However, in the transmission mode, the insertion loss and the isolation characteristic attained in the switch of the invention are remarkably superior to those in the related art.

The description given above is concerned solely with an exemplary case where the signal changeover switch of the invention is disposed between a communication apparatus and antenna for switching the transmission and reception modes of the communication apparatus. However, it is to be understood that the present invention is not limited to such embodiment alone. For example, three apparatus (e.g., an apparatus 1, an apparatus 2 and an apparatus 3) may be connected mutually by means of the signal changeover switch of the invention, and a signal may be changed between such apparatus (e.g., between apparatus 1 and 2, or between apparatus 1 and 3) by the switch of the invention. In this case, the concept of signal transmission and reception modes mentioned hereinabove can be replaced with the concept of a signal transfer mode among the apparatus. Also the signal input terminal and the signal output terminal can be replaced with a first signal input-output terminal and a second signal input-output terminal, respectively. Furthermore, the maximum current amplitude and the maximum voltage amplitude obtained from the signal input terminal can be replaced with those of the signal flowing in the field-effect transistors which constitute the FET unit.

The various numerical values and the numbers of stages of field-effect transistors described in connection with the embodiments are merely illustrative and may be modified to optimal values and numbers in accordance with the required characteristics of the signal changeover switch. The field-effect transistors employed in the switch may be any of MESFETs, JFETs and so forth. For example, the built-in voltage VBI of a JFET is approximately 1.2 V which is higher than the built-in voltage VBI (approx. 0.4 V) of a MESFET. Therefore it is preferred that JFETs be used since a greater source-drain saturation current Idss is obtainable.

Thus, according to the present invention, the gate width and the number of stages of field-effect transistors in the signal changeover switch are selectively determined with a consideration given to the power of a radio frequency signal in a transmission mode. Consequently it becomes possible to design a superior switch where adequate adjustments are devised reasonably with regard to the current and the voltage. The switch of the present invention is adapted for dealing with a high-power radio frequency signal and ensures excellent performance including a minimal insertion loss and enhanced isolation characteristic. Besides the above, there is no necessity of preparing a variety of field-effect transistors for manufacture of the switch, hence realizing remarkable advantages in the designing efficiency and the productivity.

What is claimed is:

1. A signal changeover switch having a signal input terminal, a signal output terminal and a signal input-output terminal, and comprising first, second, third and fourth units of field-effect transistors;

wherein one end of said first FET unit is connected to the signal input terminal while the other end thereof is connected to the signal input-output terminal;

one end of said second FET unit is connected to the signal input terminal while the other end thereof is grounded;

one end of said third FET unit is connected to the signal output terminal while the other end thereof is connected to the signal input-output terminal;

one end of said fourth FET unit is connected to the signal output terminal while the other end thereof is grounded;

each of the transistors constituting said first FET unit has a gate width so determined as to render the source-drain saturation current greater than the maximum current amplitude of the input signal fed from the signal input terminal;

said second FET unit consists of one or more transistor stages equal in number to the result of rounding up the numerical value which is obtained by dividing the maximum voltage amplitude of the input signal fed from the signal input terminal, by the withstand voltage of the transistors in said second FET unit; and said third FET unit consists of one or more transistor stages equal in number to the result of rounding up the numerical value which is obtained by dividing the maximum voltage amplitude of the input signal fed from the signal input terminal, by the withstand voltage of the transistors in said third FET unit.

2. The switch according to claim 1, wherein the number of transistor stages in said first FET unit is so determined as to minimize the insertion loss and the isolation value in said first FET units; and the gate width of each of the transistors constituting said second and third FET units is so determined as to minimize the insertion loss and the isolation value in said second and third FET units.

3. The switch according to claim 2, wherein the number of transistor stages in said fourth FET unit is determined in dependence on the power of the received signal, and the gate width of each of the transistors constituting said fourth FET unit is so determined as to minimize the insertion loss and the isolation value in said fourth FET unit.

* * * * *